United States Patent [19]

Beun

[11] Patent Number: 4,580,192

[45] Date of Patent: Apr. 1, 1986

[54] LATCHING AND WITHDRAWING ASSEMBLY FOR PLUG-IN CIRCUIT PACKS

[75] Inventor: Rojer A. Beun, Dunrobin, Canada

[73] Assignee: Northern Telecom Limited, Montreal, Canada

[21] Appl. No.: 555,500

[22] Filed: Nov. 28, 1983

[51] Int. Cl.⁴ .............................................. H05K 7/18
[52] U.S. Cl. ...................................... 361/395; 211/41; 361/399; 361/412; 361/415
[58] Field of Search ............... 361/393, 394, 395, 399, 361/412, 413, 414, 415, 389; 211/41

[56] References Cited

U.S. PATENT DOCUMENTS

| | | | |
|---|---|---|---|
| 3,451,034 | 6/1969 | Beale | 211/41 X |
| 3,691,430 | 9/1972 | Freitag | 361/415 |
| 4,064,551 | 12/1977 | Lightfoot | 361/399 |
| 4,091,440 | 5/1978 | Gelin et al. | 361/399 X |

FOREIGN PATENT DOCUMENTS

| | | | |
|---|---|---|---|
| 1037240 | 8/1978 | Canada | 361/415 |
| 2433385 | 6/1975 | Fed. Rep. of Germany | 361/413 |
| 2823422 | 12/1978 | Fed. Rep. of Germany | 361/415 |

Primary Examiner—R. R. Kucia
Attorney, Agent, or Firm—Sidney T. Jelly

[57] ABSTRACT

Plug-in circuit packs, as used in telecommunications systems are planar assemblies which slide into position in a support frame, with electrical connections usually made at the inner or rear end. Assistance in withdrawal, and latching when in position are provided by a latching and withdrawing assembly at the front end of the circuit pack, having an integrally molded spring cantilever, free at its forward end and having an outwardly extending projection at its free end, the cantilever defining a channel in which slides an actuator. The actuator has spaced side members joined at an inner end by a cylindrical member which slides in the channel. Flange members are formed on the inner end of each side member. Rotation of the actuator at its outermost position causes the flange members to bear on the free end of the cantilever to deflect it. This disengages the outwardly extending projection at the free end of the cantilever from a detent in the support frame. Projections on the side members bear against the support frame and bias the circuit pack out of the support frame.

5 Claims, 11 Drawing Figures

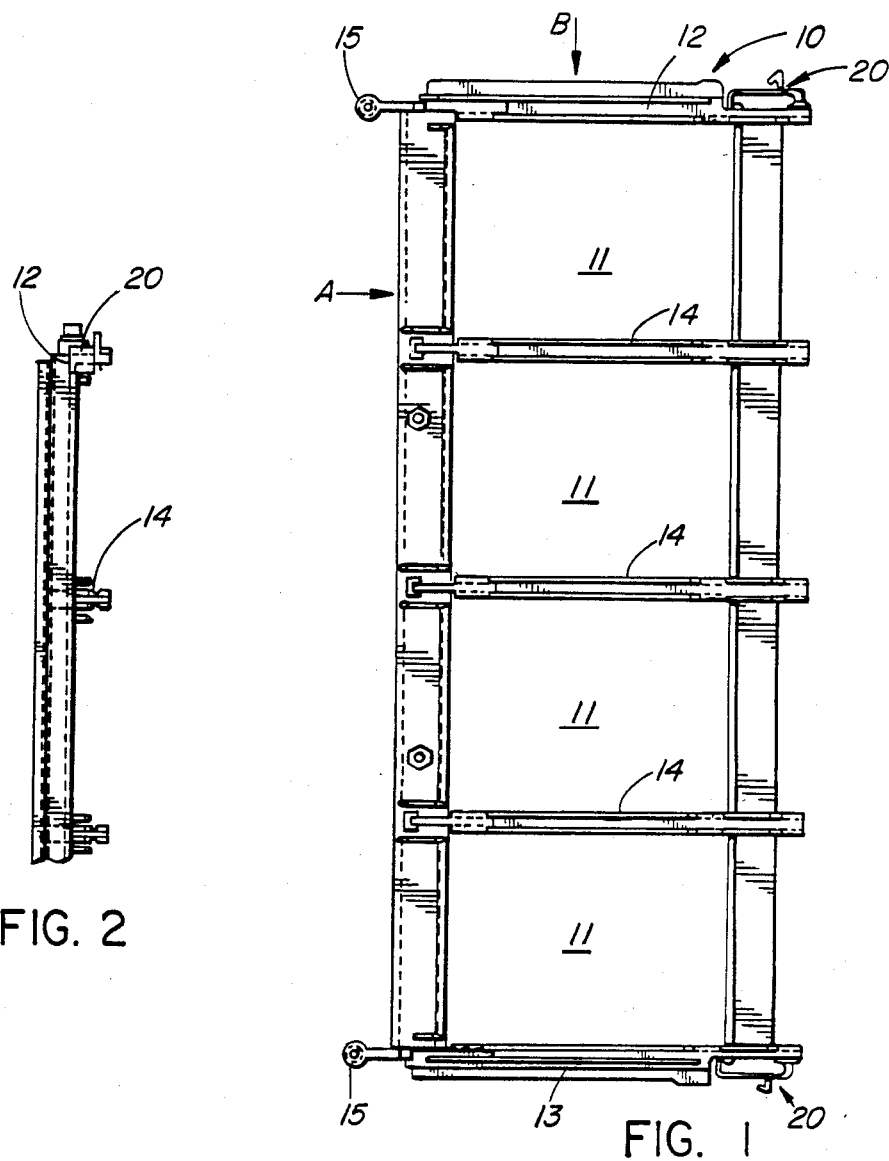

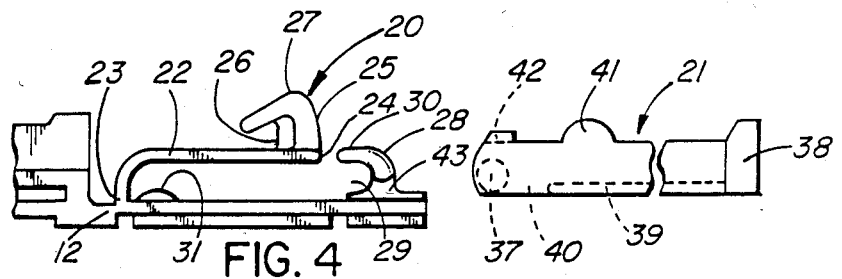
FIG. 4
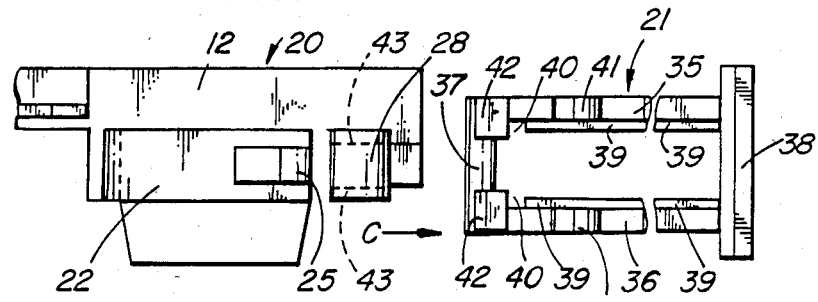
FIG. 5
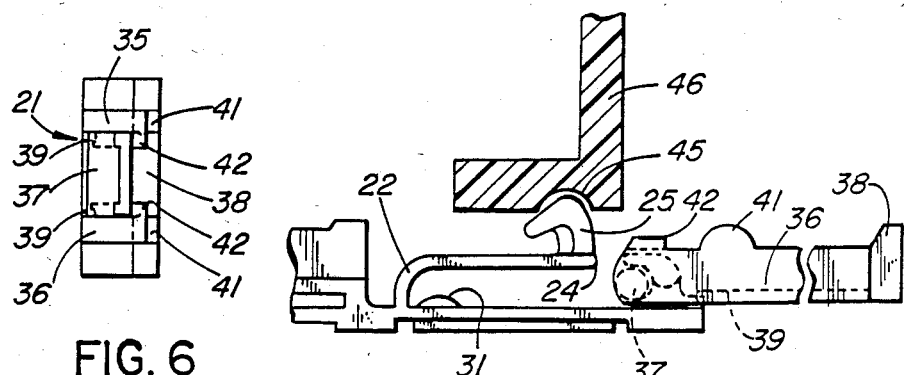
FIG. 6
FIG. 7
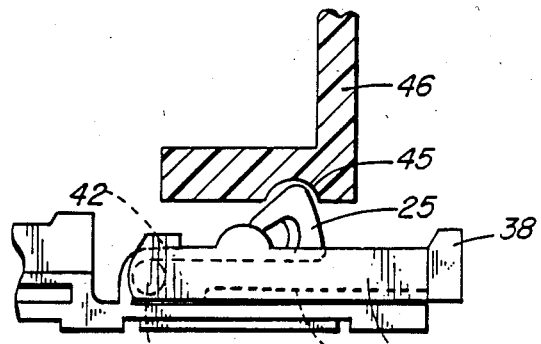
FIG. 8

LATCHING AND WITHDRAWING ASSEMBLY FOR PLUG-IN CIRCUIT PACKS

This invention relates to a latching and withdrawal assembly for plug-in circuit packs, such as are used in telecommunications systems. Circuit packs are planar assemblies which slide into position in a support frame, and have an electrical connector at one end—usually the rear end which reacts with a backplane having a large number of individual connections. Up to one hundred and sixty individual connections can be provided. Even with relatively low individual insertion and withdrawal forces, a total withdrawal force upwards of 50 lbs. can be required to unplug a circuit pack. Due to the very close packing of circuit packs in the support frame, it is very difficult to grip a circuit pack to initiate withdrawal. In most cases there are no clearances in which fingers can be inserted.

However, vibration can cause a circuit pack to disengage, that is become unplugged, and it is necessary to provide latching to prevent undesired withdrawal. It is necessary to arrange for disengagement of the latching when deliberate withdrawal is required.

The present invention provides an assembly which is at the front end of a circuit pack and which has a deflectable latching member which engages in a detent in the support frame and also a self storing actuator which, in an extended position, is moved first to deflect the latch member and then reacts against the support frame to initiate withdrawal of the circuit pack. On reinsertion of a circuit pack the actuator is usually pushed in first and then the circuit pack pushed into the support frame. When the circuit pack is fully inserted, there is an audible click as the latch member snaps into the detent. Usually the circuit packs are inserted in vertical planes, and a latching and withdrawal assembly is normally provided at top and bottom at the front end.

Broadly, a latching and withdrawal assembly comprises an integrally molded spring cantilever, free at its forward end and having an outwardly extending projection at the free end, the lever defining a channel in which slides an actuator. The actuator has spaced side members joined at an inner end by a cylindrical pivot member with a flange at the inner end of each side member, the flanges opposed and extending over the cantilever. Rotation of the actuator at its outermost position causes the opposed flanges to bear on the cantilever and deflect it to disengage the projection. Projections on the side members engage with and react against the support frame to initiate withdrawal of the circuit pack. A detent holds the actuator in a fully innermost position.

The invention will be readily understood by the following description of an embodiment, by way of example, in conjunction with the accompanying drawings, in which:

FIG. 1 is a side view of a circuit pack member;

FIG. 2 is a view in the direction of arrow A in FIG. 1;

FIG. 3 is a view in the direction of arrow B in FIG. 1;

FIG. 4 is a side view of the two parts of the latch and actuator assembly, the two parts shown separated for clarity;

FIG. 5 is a top view of the two parts illustrated in FIG. 4;

FIG. 6 is a view on the inner end of the actuator of FIGS. 4 and 5, in the direction of arrow C in FIG. 5;

FIG. 7 is a side view of the assembly of FIG. 4, with the two parts assembled, and illustrating part of the support frame, the actuator in an outermost position;

Figure 8A:
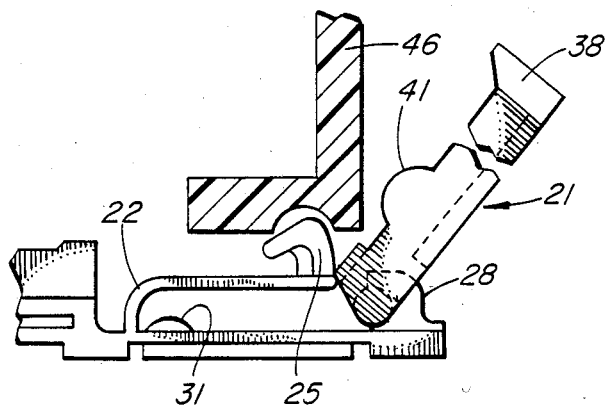
FIG. 8 is a view similar to that of FIG. 7, but with the actuator in an innermost position.
Figure 8B:
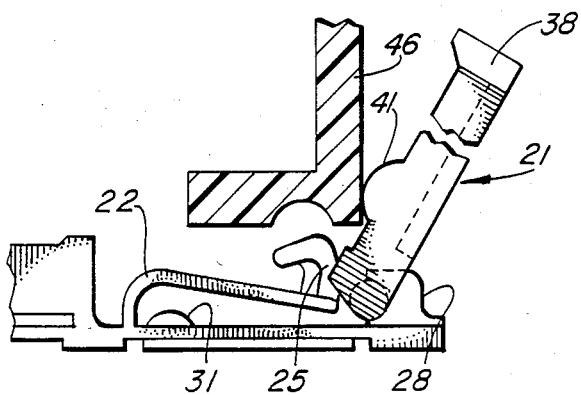
Figure 9:
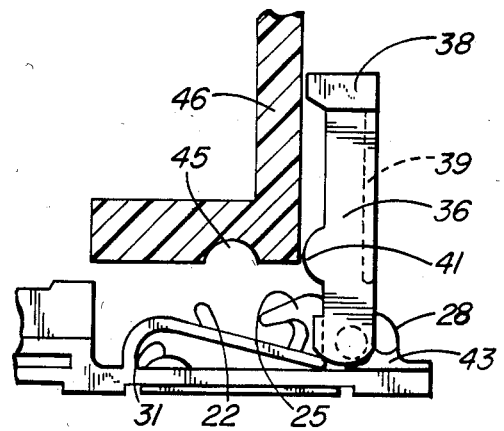

FIGS. 8(a) and 8(b) show the actuator in intermediate positions during actuation;

FIG. 9 is a view similar to that of FIG. 7, but with the actuator rotated to deflect the latch and in engagement with the support frame to initiate withdrawal.

Illustrated in FIGS. 1, 2 and 3 is a molded member, indicated generally at 10, which, in the example illustrated, is adapted to carry four ceramic circuit boards at spaces 11. The top and bottom members 12 and 13, and intermediate members 14, are formed with channels which guide and hold the circuit boards. The particular form of member 10, in so far as the shaping of the members 12, 13 and 14 is concerned, is not a feature of the present invention and is not described in detail. The particular form of member 10, as regards these details, is fully described in co-pending application Ser. No. 555,669 filed Nov. 28, 1983, entitled MOUNTING FOR LINE CARDS ON CIRCUIT BOARDS IN TELECOMMUNICATIONS APPARATUS in the same name as the present application, the disclosure of which is included herein by specific reference.

Generally, the member 10 is attached to a large printed circuit board, not shown, by screws through bosses 15. The end of the large printed circuit board remote from member 10 normally carries the before mentioned large number of individual connections. The edge of the printed circuit board adjacent member 10 can be arranged to fit in a channel 16 defined in the edge of the member 10.

The present invention is particularly concerned with the latch member, indicated generally at 20 in FIGS. 1, 2 and 3 and its associated actuator, not shown in these figures. The latch member is seen in larger detail in FIGS. 4 and 5, together with the actuator, indicated at 21 in FIGS. 4, 5 and 6. While illustrated as separated parts, in FIGS. 4 and 5, they are assembled together on the member 10, in use, as seen in FIG. 7.

Considering FIGS. 4 and 5, the latch member 20 is molded integrally with the member 10 and in particular is molded as part of an end wall or member 12. The latch member comprises a spring cantilever 22 attached at an inner or rear end 23 to the front end of wall 12 and free at its outer or forward end 24. An upwardly extending projection or latch 25 is formed at the free or outer end 24. In the example, the projection has an arcuate recess 26 and a sharply convex top 27. Adjacent the free end 24 of the cantilever 22 is a further projection 28 on the wall or member 12, the projection curving out and down to the wall 12. This member has an arcuate recess 29 and its inner end 30 is spaced a short distance from end 24 of the latch member. Adjacent the inner end 23 of the latch member a small projection 31 is formed on the surface of the wall 12.

Cooperatively engaged with the latch member 20 is the actuator 21. The actuator comprises two spaced apart levers or arms 35 and 36, joined at their inner ends by a cylindrical member 37. At their outer ends arms 35 and 36 are connected by a web 38 which extends a short distance beyond the arms and forms a handle. Along the lower edge of each arm is an inwardly extending rib 39, which ends a short distance from the cylindrical member 37 to form a gap 40, at each side. A convex projection 41 on each arm 35 and 36 is positioned intermediate the ends of the arms and at the inner ends of the arms short flange members 42 extend inwards towards each other.

The actuator 21 is assembled to the latch member 20 by deflecting the free end 24 of the cantilever 22 upwards and pushing the cylindrical member 37 between the ends 24 and 30. The cylindrical member 37 slides back and forth under the cantilever 22. The flange members 42 move over the cantilever 22 when the actuator is pushed inward and the ribs 39 slide in recesses 43 at the base of the member 28.

The actuator 21 is shown in its outermost position in FIG. 7. The cylindrical member 37 rests in the recess 29 of member 28. The ribs 39 are clear of the recesses 43 and in this position it is possible to rotate the actuator on the cylindrical member 37, web 38 being moved upward. The projection or latch 25 has its portion 27 seated in a detent 45 in the support frame 46. The actuator can be pushed inward to a position as illustrated in FIG. 8. The cylindrical member 37 can be snapped over the projection 31 holding the actuator in position. The ribs 39 will be in the recesses 43 and the actuator is thus prevented from pivoting upward. The flange members 42 slide along over the cantilever 22. As stated previously, the actuator 21 is normally pushed fully into the latch member before the circuit pack is inserted into the support frame. However, this is not essential. As the circuit pack is pushed into the support frame, the cantilever deflects down to permit the latch 25 to pass below the frame 46 and snap up into the detent 45.

To withdraw a circuit pack, the actuating member is first pulled out. Generally there is a latching assembly at the top and the bottom of a circuit pack, and both actuating members are pulled out. The situation will then be as in FIG. 7. The actuator is then pivoted or rotated, the web 38 moved upward. The actuator is able to rotate as the ribs 39 are clear of the recesses 43. As the actuator pivots or rotates, the flange members 42 bear on the free end 24 of the cantilever, pushing it down. This deflects the latch 25 down, and eventually completely removes the latch 25 from engagement in the detent 45. The latch 25 is released from the detent 45 before the actuator is fully pivoted or rotated. The projection 41 moves into contact with the support frame 46 and continued pivotting or rotation of the actuator causes it to pivot also about the projection 41. This causes the circuit pack to be pulled out a short distance. The amount of travel of the circuit pack and the leverage obtained, will be determined by the distance from the web 38 to the axis of the cylindrical member 37, and the distance from the contact position on the projection 41 to the axis of the cylindrical member 37. The circuit pack can then be gripped at its front edge and pulled right out or the actuators pivotted down and then used to pull out the circuit pack.

The web 38 can be provided with a flat front surface for marking identification details thereon. The latch assembly is completely within the overall dimensions of the circuit pack.

Although described for the arrangement in which circuit packs are positioned in support frames in vertical planes, the latching assembly of the invention is also applicable for circuit packs and other planar assemblies positioned in support frames in a horizontal plane. In such an arrangement, the latch assemblies would be at one or both sides, and the terms up and down used hereinbefore should be interpreted to include sideways for such alternate position.

What is claimed is:

1. A circuit pack for insertion into a support frame, the pack comprising a frame having front and back edges and spaced apart end frame members extending from said front edge to said back edge, and a latching and withdrawal assembly on each end frame member adjacent said front edge, each latching and withdrawal assembly comprising:

a spring cantilever member extending parallel to said end frame member, said cantilever member integral at a rear end with said end frame member and free at its forward end, the cantilever member and said end frame member defining a channel;

a projection at said free end of said cantilever member, the projection extending in a direction away from said end frame member;

a projection on said end frame member positioned forward of and aligned with said cantilever member, and including an arcuate recess facing towards said channel;

an actuator slidably mounted in said channel, said actuator having two spaced parallel arms joined at an inner end by a cylindrical member and joined at their outer ends by a transverse web, the cylindrical member positioned in and sliding in said channel from an inner position to an outer position, the cylindrical member positioned in said arcuate recess in its outer position; said actuator pivotable in its outer position, whereby an abutment at said inner end of said actuator is moved into engagement with said free end of said cantilever member to depress the cantilever member and release said projection at said free end from a detent in said support frame, and said actuator bears on a surface of said support frame to urge said circuit pack from said support frame.

2. A circuit pack as claimed in claim 1, said projection at said free end of said cantilever member being of reduced thickness relative to the width of said cantilever member said abutment at said inner end of said actuator comprising two opposed flange members extending inwardly from said parallel arms, the flanges overlapping said cantilever member and spaced at their inner ends a distance to permit passage past said projection.

3. A circuit pack as claimed in claim 1, including a convex projection on each arm of said actuator, at a position intermediate the ends of the arms, said convex projections bearing on said surface of said support frame to urge the circuit pack from the support frame on pivoting of said actuator.

4. A circuit pack as claimed in claim 1, wherein said transverse web joining the outer ends of said parallel arms extends beyond said arms to form a handle.

5. A circuit pack as claimed in claim 2, including an inwardly projecting rib at an edge of each of said parallel arms, said ribs extending from an outer end of each arm and stopping short of said cylindrical member to define a gap at each side, a recess on each side of said projection on said frame member, at the base of the projection, said ribs engaging in said recesses on sliding of said actuator from its inner position, said projection on said frame member positioned in said gaps at the outer position of the actuator to enable pivotting of said actuator.

* * * * *